(12) United States Patent
Hong et al.

(10) Patent No.: US 8,779,547 B2
(45) Date of Patent: Jul. 15, 2014

(54) ELECTROPLATING METHODS FOR FABRICATING INTEGRATED CIRCUIT DEVICES AND DEVICES FABRICATED THEREBY

(71) Applicant: Samsung Electronics Co., Ltd., Suwon-si (KR)

(72) Inventors: Jongwon Hong, Gyeonggi-do (KR); Insun Park, Seoul (KR); Hei Seung Kim, Gyeonggi-do (KR); Jongmin Baek, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/707,425

(22) Filed: Dec. 6, 2012

(65) Prior Publication Data

US 2013/0147005 A1    Jun. 13, 2013

(30) Foreign Application Priority Data

Dec. 7, 2011    (KR) .................. 10-2011-0129985

(51) Int. Cl.
| | | |
|---|---|---|
| *H01L 21/338* | (2006.01) | |
| *H01L 27/04* | (2006.01) | |
| *H01L 21/288* | (2006.01) | |
| *H01L 27/115* | (2006.01) | |
| *H01L 27/108* | (2006.01) | |
| *H01L 27/105* | (2006.01) | |

(52) U.S. Cl.
CPC ............ *H01L 27/04* (2013.01); *H01L 21/2885* (2013.01); *H01L 27/11575* (2013.01); *H01L 27/10894* (2013.01); *H01L 27/11548* (2013.01); *H01L 27/11526* (2013.01); *H01L 27/10882* (2013.01); *H01L 27/11573* (2013.01); *H01L 27/1052* (2013.01)
USPC ............. 257/508; 257/E21.583; 257/E21.304

(58) Field of Classification Search
USPC ........... 257/E21.583, E21.304, E21.175, 758; 438/638, 687, 633, 678, 700
See application file for complete search history.

(56) References Cited

U.S. PATENT DOCUMENTS

| | | | |
|---|---|---|---|
| 6,245,676 B1 | 6/2001 | Ueno | |
| 6,486,066 B2 * | 11/2002 | Cleeves et al. ................ | 438/692 |
| 6,664,642 B2 * | 12/2003 | Koubuchi et al. ............. | 257/776 |
| 6,717,267 B1 * | 4/2004 | Kunikiyo ....................... | 257/758 |
| 6,767,826 B2 | 7/2004 | Abe | |
| 7,114,251 B2 | 10/2006 | Mashino | |
| 7,124,386 B2 | 10/2006 | Smith et al. | |
| 7,154,184 B2 | 12/2006 | Asai et al. | |
| 7,446,040 B2 | 11/2008 | Murray et al. | |
| 7,470,630 B1 | 12/2008 | Chen et al. | |
| 7,767,570 B2 | 8/2010 | Chen et al. | |

FOREIGN PATENT DOCUMENTS

| | | |
|---|---|---|
| JP | 2001-332557 | 11/2001 |
| KR | 10-2009-0043948 A | 5/2009 |

\* cited by examiner

*Primary Examiner* — Zandra Smith
*Assistant Examiner* — Paul Patton
(74) *Attorney, Agent, or Firm* — Myers Bigel Sibley & Sajovec, PA

(57) ABSTRACT

Provided are methods of fabricating a semiconductor device and semiconductor devices fabricated thereby. In the methods, dummy recess regions may be formed between cell recess regions and a peripheral circuit region. Due to the presence of the dummy recess regions, it may be possible to reduce a concentration gradient of a suppressor contained in a plating solution near the dummy pattern region, to make the concentration of the suppressor more uniform in the cell pattern region, and to supply an electric current more effectively to the cell pattern region. As a result, a plating layer can be more uniformly formed in the cell pattern region, without void formation therein.

12 Claims, 11 Drawing Sheets

ELECTROPLATING METHODS FOR FABRICATING INTEGRATED CIRCUIT DEVICES AND DEVICES FABRICATED THEREBY

CROSS-REFERENCE TO RELATED APPLICATIONS

This U.S. non-provisional patent application claims priority under 35 U.S.C. §119 to Korean Patent Application No. 10-2011-0129985, filed on Dec. 7, 2011, in the Korean Intellectual Property Office, the contents of which are hereby incorporated by reference herein in its entirety.

BACKGROUND OF THE INVENTION

Embodiments of the inventive concepts relate to methods of fabricating integrated circuit devices and integrated circuit devices fabricated thereby.

Semiconductor devices may be required to have higher integration, higher density, lower power consumption, and faster operating speeds. A semiconductor device with highly integrated circuits may include a multi-layered interconnection structure, which may be formed of a metal material (e.g., aluminum). The formation of the aluminum interconnection lines may include depositing an aluminum layer on an insulating layer and etching it to expose the insulating layer.

However, the use of copper, instead of aluminum, as a material for the interconnection line, is growing as a design rule of the semiconductor devices decreases. This may be due to the relatively high electrical resistivity of aluminum. For example, as a width of an aluminum interconnection line decreases, its resistance increases, and thus it may be a difficult to realize semiconductor devices with higher operating speeds. Copper may offer advantages in cost and electrical conductivity, but there may be difficulty in patterning a copper layer using an etching technique. A damascene process may also be used to form copper interconnection lines. For example, the formation of the copper interconnection lines may include forming an insulating layer with a recess region for disposing a copper interconnection line, forming a barrier layer and a seed layer thereon, forming a copper layer to fill the recess region using an electroplating technique, and then removing the copper layer from a top surface of the interlayer dielectric.

However, a thickness of the seed layer may decrease with the decreasing design rule, which can lead to an increase in electrical resistance of the seed layer, especially for the crowded interconnection lines provided in a cell array region. As the result of the increase in electrical resistance of the seed layer, an electric current may not be sufficiently supplied to the cell array region during the electroplating process, such that the plating layer may be formed to have a void or cavity therein.

In addition, differences in pattern density between a peripheral circuit region and the cell array region may lead to an abrupt change in concentration of a plating solution, which may cause difficulties in uniformly forming the plating layer and in preventing the void from being formed.

SUMMARY

Embodiments of the inventive concepts provide semiconductor device fabricating methods capable of uniformly forming a plating layer without voids.

Other embodiments of the inventive concepts provide semiconductor devices with improved reliability and a high integration density.

According to example embodiments of inventive concepts, a method of fabricating a semiconductor device may include forming an interlayer dielectric on a substrate including a cell array region and a peripheral circuit region, etching the interlayer dielectric to form a plurality of cell recess regions and at least one dummy recess region in the cell array region, forming a seed layer on the interlayer dielectric, and performing an electroplating process to form a plating layer filling the cell recess regions and the dummy recess region. The dummy recess region may be formed between the cell recess regions and the peripheral circuit region.

In example embodiments, the etching of the interlayer dielectric may be performed to form a plurality of the dummy recess regions in the cell array region, and a space between the dummy recess regions adjacent to each other may be greater than that between the cell recess regions adjacent to each other.

In example embodiments, the cell recess region may be formed to have a substantially linear shape extending along a first direction, and the dummy recess region may be formed to have a bar shape extending along a second direction crossing the first direction.

In example embodiments, the cell array region may include a cell pattern region, in which the cell recess regions may be formed, and at least one dummy pattern region, in which the at least one dummy recess region may be formed, and the dummy pattern region may be positioned between the cell pattern region and the peripheral circuit region.

In example embodiments, an occupying area of the interlayer dielectric in the dummy pattern region may be smaller than that in the peripheral circuit region and greater than that in the cell pattern region.

In example embodiments, the electroplating process may further include treating the substrate provided with the seed layer using a plating solution containing a suppressor, and a concentration of the suppressor in the dummy pattern region may be lower than that in the peripheral circuit region and higher than that in the cell pattern region, during the electroplating process.

In example embodiments, the cell array region may include a plurality of the dummy pattern regions, which may be symmetrically disposed with respect to the cell pattern region.

In example embodiments, a length of the dummy recess region may be shorter than that of the cell recess region, in the first direction.

According to further example embodiments of inventive concepts, semiconductor device may include a substrate including a cell array region and a peripheral circuit region, an interlayer dielectric disposed on the substrate, a plurality of cell patterns disposed in the cell array region, each of the cell patterns being provided in the interlayer dielectric, and a plurality of dummy patterns disposed in the cell array region, the dummy patterns being provided between the cell patterns and the peripheral circuit region. A space between the dummy patterns adjacent to each other may be greater than that between the cell patterns adjacent to each other.

In example embodiments, a space between the dummy patterns adjacent to each other may be greater than that between the cell patterns adjacent to each other.

In example embodiments, each of the cell patterns may have a substantially linear shape extending along a first direction, and each of the dummy patterns may have a bar shape extending along a second direction crossing the first direction.

In example embodiments, a length of the dummy pattern may be shorter than that of the cell pattern, in the first direction.

According to still further embodiments, an integrated circuit device includes a substrate including a cell array region and a peripheral circuit region, and a plurality of coplanar plated conductive patterns in the cell array region. The conductive patterns are separated from one another by an interlayer dielectric. The conductive patterns may respectively comprise one or more of a plated layer, a seed layer, and a barrier layer. The conductive patterns include a plurality of cell patterns and a plurality of dummy patterns. The dummy patterns are provided between the cell patterns and the peripheral circuit region. The cell patterns continuously extend along a first direction. The dummy patterns include a plurality of segments that discontinuously extend along the first direction and are separated from one another by the interlayer dielectric.

In some embodiments, a density of the dummy patterns may provide a transition between that of the cell patterns in the cell array region and that of patterns in the peripheral circuit regions.

In some embodiments, adjacent segments of the dummy patterns may be separated by a distance greater than that between adjacent ones of the cell patterns.

In some embodiments, an area of the interlayer dielectric between the dummy patterns may be greater than an area of the interlayer dielectric between the cell patterns in the cell array region. In some embodiments, the area of the interlayer dielectric between the dummy patterns may be less than an area of the interlayer dielectric between patterns in the peripheral circuit region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
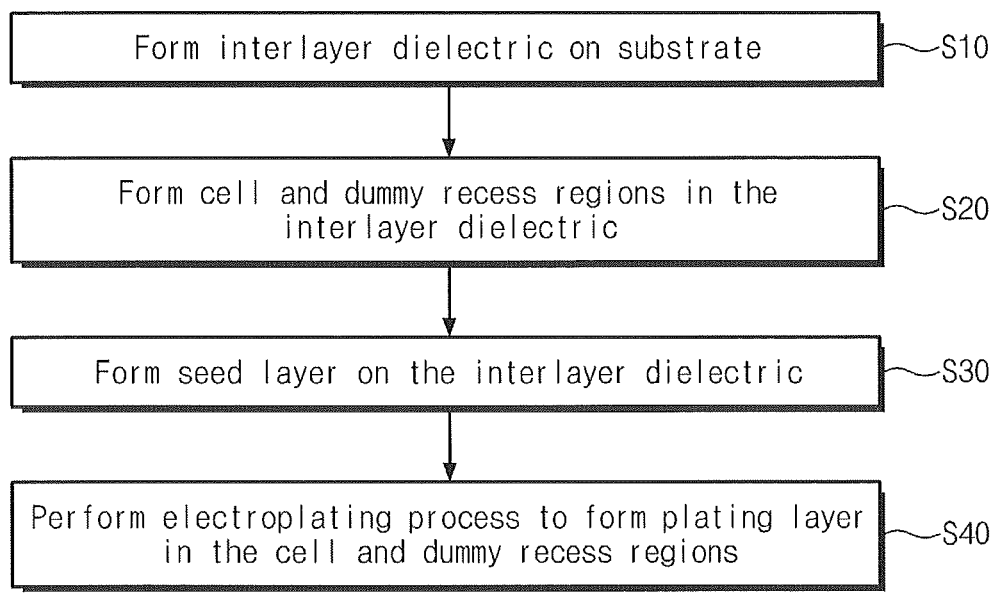
FIG. 1 is a flowchart illustrating methods of fabricating a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
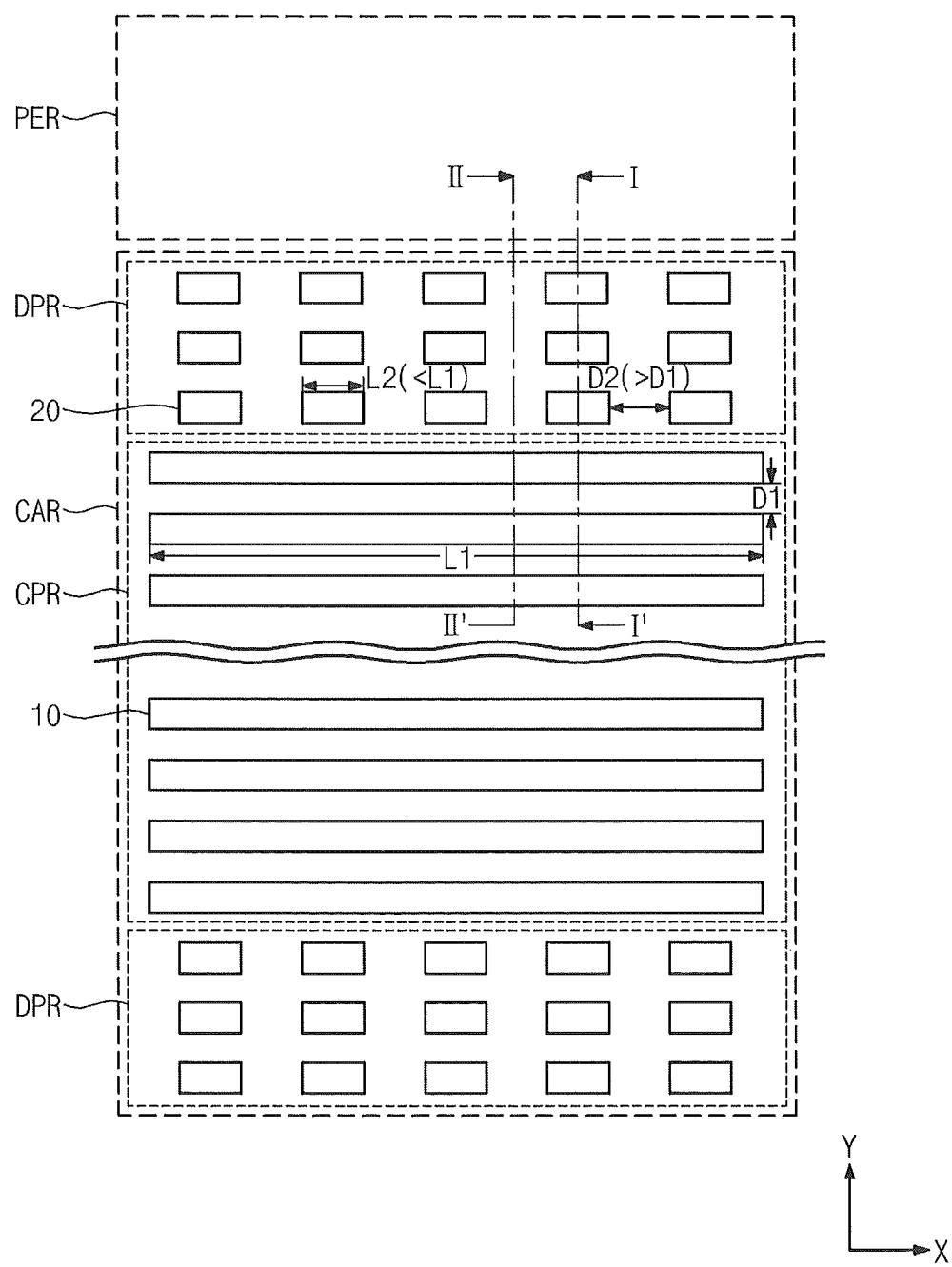
FIG. 2 illustrates a layout of a substrate according to example embodiments of the inventive concepts.
Figure 3A:
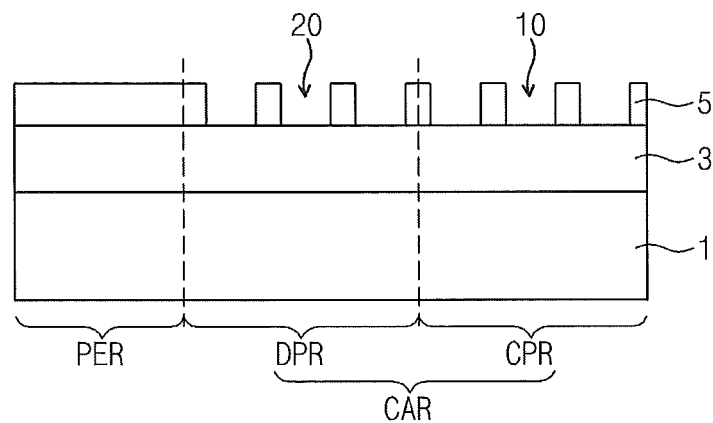
FIGS. 3A and 3B are sectional views taken along lines I-I' and II-II', respectively, of FIG. 2.

FIG. 1 is a flowchart illustrating a method of fabricating a semiconductor device according to example embodiments of the inventive concepts. FIG. 2 illustrates a layout of a substrate according to example embodiments of the inventive concepts, and FIGS. 3A and 3B are sectional views taken along lines I-I' and II-II', respectively, of FIG. 2.

Referring to FIGS. 1, 2, 3A and 3B, an interlayer dielectric (ILD) 5 may be formed on a substrate 1 (in S10). The substrate 1 may include a cell array region CAR and a peripheral circuit region PER. In example embodiments, the cell array region CAR may include at least one cell pattern region CPR and at least one dummy pattern region DPR. The dummy pattern region DPR may be provided between the peripheral circuit region PER and the cell pattern region CPR. In example embodiments, the cell array region CAR may include a plurality of the dummy pattern regions DPR, which may be symmetrically disposed with respect to the cell pattern region CPR. For example, as shown in FIG. 2, the dummy pattern regions DPR may be provided on opposite sides of the cell pattern region CPR. Similarly, the peripheral circuit region PER may be disposed to have a symmetric configuration with respect to the cell array region CAR. Furthermore, in some embodiments, the peripheral circuit region PER may be configured to surround the cell array region CAR. In example embodiments, there may be a sense amplifier region and/or a decoding circuit region in the peripheral circuit region PER. Before the formation of the interlayer dielectric 5, a lower insulating layer 3 may be formed on the substrate 1. A device isolation layer and a plurality of transistors may be formed on the substrate 1, before the formation of the lower insulating layer 3. In example embodiments, the lower insulating layer 3 may serve as an etch stop layer or a lower interlayer dielectric covering such transistors.

The interlayer dielectric 5 may be etched to form cell recess regions or trenches 10 and dummy recess regions or trenches 20 (in S20). The cell recess regions 10 may be formed on the cell pattern region CPR, and the dummy recess regions 20 may be formed on the dummy pattern region DPR. Each of the cell recess regions 10 may be a substantially linear groove continuously extending along a first direction X (e.g., the X-direction). Each of the dummy recess regions 20 may be formed to have a hole-like structure or a bar-like trench or groove or other discontinuous structure extending along the first direction X. In example embodiments, at least one of the cell recess regions 10 may be configured to provide a space for disposing an interconnection line (e.g., a bit line). A space D2 between adjacent ones of the dummy recess regions 20 may be greater than a distance D1 between adjacent ones of the cell recess regions 10. In addition, a length L2 of the dummy recess region 20 may be shorter than a length L1 of the cell recess region 10 when measured along the first direction X. An occupying area ratio per unit area of the interlayer dielectric 5 in the dummy pattern region DPR may be smaller than in the peripheral circuit region PER and greater than in the cell pattern region CPR. In some embodiments, a volume of the interlayer dielectric 5 in the dummy pattern region DPR may be less than that in the peripheral circuit region PER and greater than that in the cell pattern region CPR.

Figure 3B:
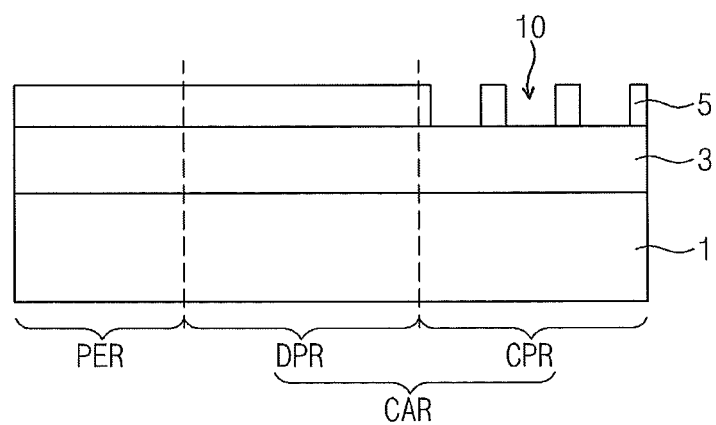
Figure 4A:
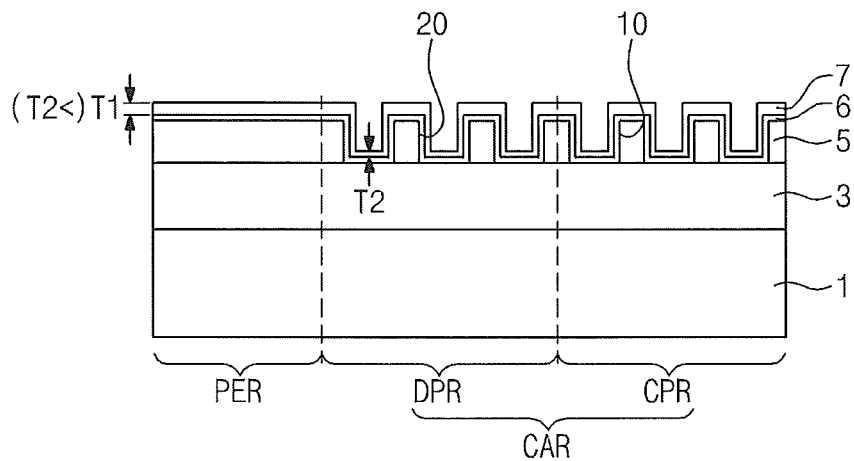
FIGS. 4A, 5A and 9A are sectional views sequentially illustrating fabrication steps according to example embodiments of the inventive concepts with respect to the cross-section shown in FIG. 3A.
Figure 4B:
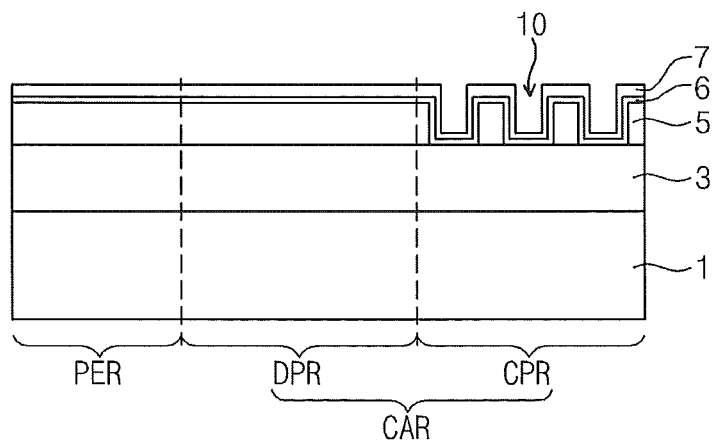
FIGS. 4B, 5B and 9B are sectional views sequentially illustrating fabrication steps according to example embodiments of the inventive concepts with respect to the cross-section shown in FIG. 3B.
Figure 5A:
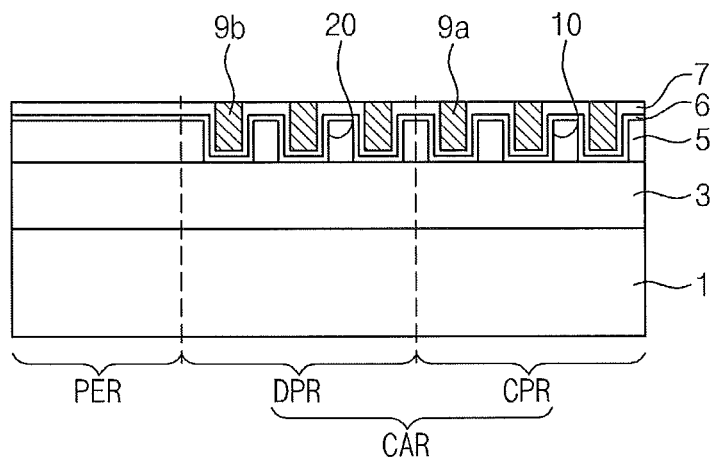
Figure 9A:
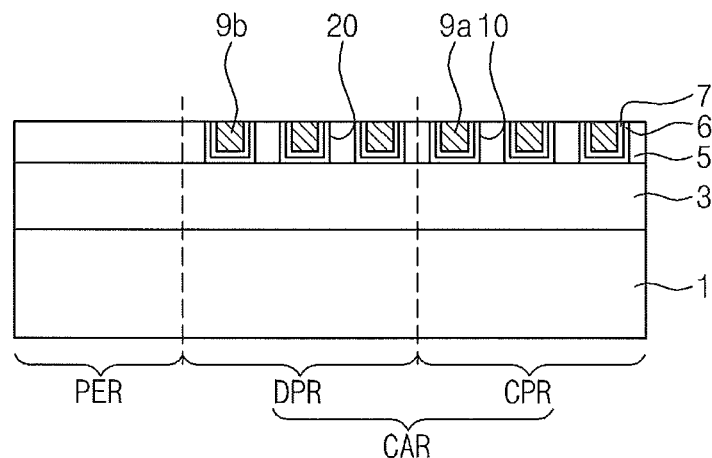

FIGS. 4A, 5A and 9A are sectional views illustrating fabrication steps to be performed on the structure shown in FIG. 3A, and FIGS. 4B, 5B and 9B are sectional views illustrating fabrication steps to be performed on the structure shown in FIG. 3B.

Referring to FIGS. 1, 4A and 4B, a barrier layer 6 may be conformally formed on the etched interlayer dielectric 5 including the cell recess regions 10 and the dummy recess regions 20 therein. The barrier layer 6 may be formed of titanium, titanium nitride, tantalum, and/or tantalum nitride. The barrier layer 6 may be formed using a deposition process, such as chemical vapor deposition (CVD) or physical vapor deposition (PVD). The barrier layer 6 may be configured to prevent a copper layer to be provided in a subsequent process from being diffused into the etched interlayer dielectric 5. A seed layer 7 may be formed on the etched interlayer dielectric 5 including the barrier layer 6 thereon (in S30). The seed layer 7 may be formed of, for example, copper. The seed layer 7 may be formed using a deposition process, such as PVD. In example embodiments, the seed layer 7 may be formed to have a first thickness T1 on the interlayer dielectric 5 outside of the recess regions 10 and 20 and a second thickness T2 in the cell and dummy recess regions 10 and 20, where the first thickness T1 may be greater than the second thickness T2. This may be due to difficulty in supplying a source gas for the seed layer 7 into the recess regions 10 and 20 during the deposition process. This effect can be expected to increase as a design rule decreases.

Figure 5B:
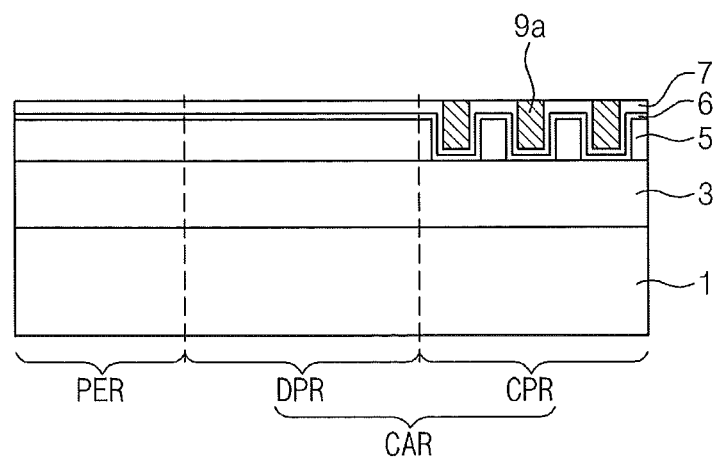

Referring to FIGS. 1, 5A and 5B, an electroplating process may be performed to form a plating layer 9a and 9b in the cell recess region 10 and the dummy recess region 20 (in S40). The plating layer 9a and 9b may include a cell pattern 9a provided in the cell recess region 10 and a dummy pattern 9b provided in the dummy recess region 20.

The electroplating process will be described in more detail below.

Figure 6:
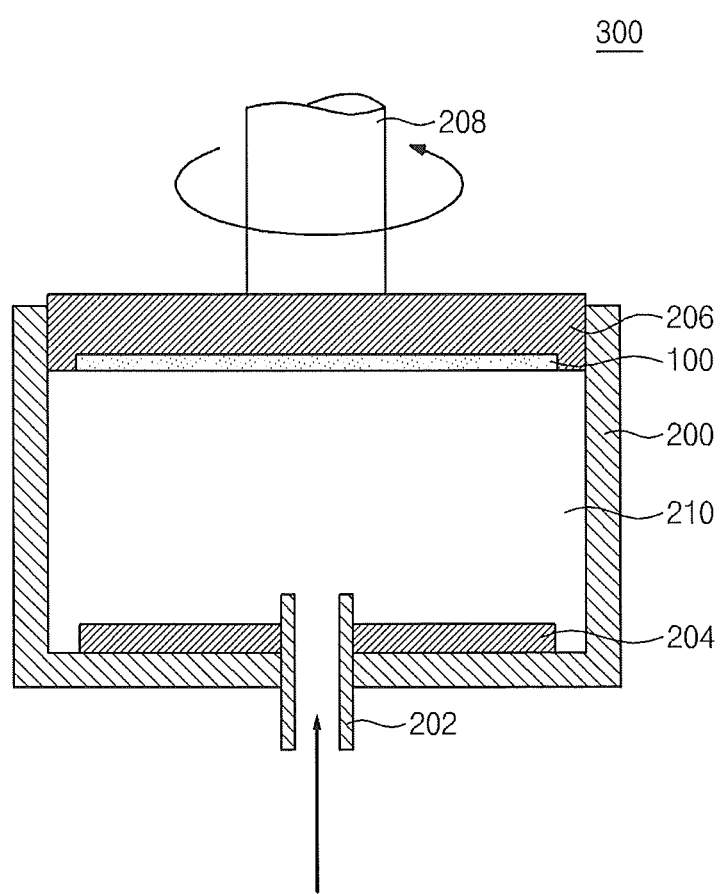
FIG. 6 is a sectional view schematically showing an example of electroplating apparatus according to example embodiments of the inventive concepts.
Figure 7:
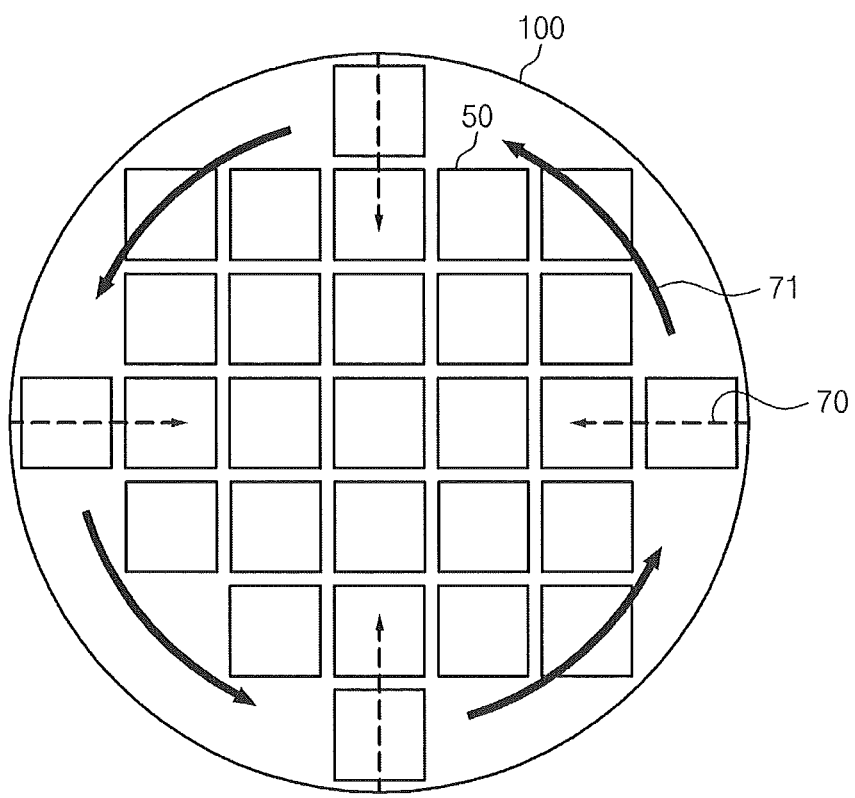
FIG. 7 illustrates electric current and plating solution flow on a wafer during an electroplating process according to example embodiments of the inventive concepts.

FIG. 6 is a sectional view schematically showing an example of electroplating apparatus according to example embodiments of the inventive concepts. FIG. 7 shows electric current and plating solution flow on a wafer during an electroplating process, and FIGS. 8A and 8B are schematic diagrams showing the distribution of additives on a surface of a seed layer, when electroplating processes are performed on the structures shown in FIGS. 4A and 4B, respectively.

Referring to FIG. 6, an electroplating apparatus 300 may include a plating bath 200. The plating bath 200 may be shaped like a cylinder whose top is open, and may have an inner space capable of containing a wafer 100 and a plating solution 210 therein. A chuck 206 may be provided at an upper portion of the plating bath 200 to fix the wafer 100. The chuck 206 may be connected to a rotating axis 208, and may be configured to be rotatable about the rotating axis 208. An upper electrode may be electrically connected to the wafer 100, in the chuck 206. A lower electrode 204 may be provided below the plating bath 200. A plating solution supplying conduit 202 may be provided at a lower portion of the plating bath 200 to supply a plating solution 210 into the plating bath 200.

Referring to FIG. 7, the wafer 100 may include a plurality of chip regions 50. Each of the chip regions 50 may include the peripheral circuit region PER and the cell array region CAR of FIG. 2. An electric current may flow from an edge of the wafer 100 toward a center portion of the wafer 100, as depicted by a first arrow 70, while the plating solution 210 may flow along a substantially circular path, depicted by a second arrow 71, on the wafer 100.

Figure 8A:
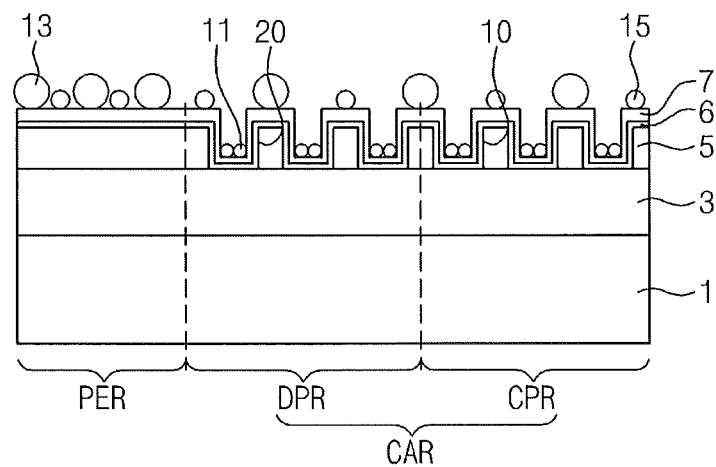
FIGS. 8A and 8B are schematic diagrams illustrating the existence of additives on a surface of a seed layer, when electroplating processes according to example embodiments of the inventive concepts are performed with respect to the cross-section shown in FIGS. 4A and 4B, respectively.
Figure 8B:
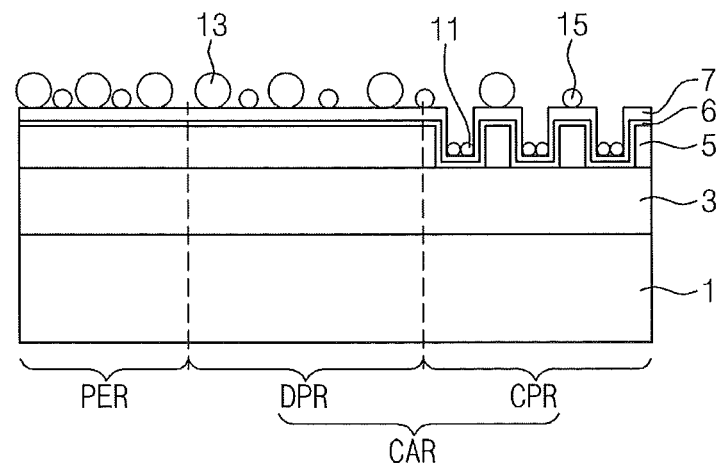

Referring to FIGS. 6, 8A and 8B, the plating solution 210 may include an electrolyte solution allowing an electric current to flow therethrough. For example, the plating solution 210 may contain sulfuric acid ($H_2SO_4$), copper sulfate ($Cu_2SO_4$), hydrochloric acid (HCl), and so forth. In addition, the plating solution 210 may further include an additive provided to form a more uniform plating layer. The additive may include a suppressor 13, an accelerator 11, and/or a leveler 15. The suppressor 13 may be selected to suppress growth of a plating layer or movement of metal ions constituting the plating layer, and the accelerator 11 may be selected to serve as a catalyst for reducing reaction of metal ions constituting the plating layer, thereby increasing a deposition rate of metals constituting the plating layer. The leveler 15 may be adsorbed on an electrode surface to reduce a current efficiency and a deposition rate, and thus, the plating layer may have a substantially flat top surface. The suppressor 13 may have a large particle size and may exist or accumulate mainly outside the recess regions 10 and 20 (e.g., on the interlayer dielectric 5), rather than in the recess regions 10 and 20. Accordingly, a concentration of the suppressor 13 may be proportional to an occupying area of the interlayer dielectric 5 or an area of a top surface of the seed layer 7. The accelerator 11 may have a smaller particle size and may exist or accumulate mainly in the recess regions 10 and 20. The plating layer may be hardly formed at a region provided with the suppressor 13 and may be more easily formed at a region provided with the accelerator 11, and thus, the plating layer 9a and 9b may be deposited on bottom surfaces of the trenches/recess regions 10, 20 and may extend upward to fill the recess regions 10 and 20.

Referring to FIGS. 6 and 7, the plating solution 210 may flow along a substantially circular path, depicted by the second arrow 71, on or along a surface of the wafer 100. The flow of the plating solution 210 may lead to differences in concentration of the additives (e.g., the suppressor 13) on the cell array region CAR of the substrate 1.

For example, due to the flow of the plating solution 210, the concentration of the suppressor 13 may be higher at an edge of the cell array region CAR adjacent to the peripheral circuit region PER than at a more central portion of the cell array region CAR. This may be due to an abrupt change in pattern density at the edge of the cell array region CAR. Accordingly, in the traditional case where the cell recess regions 10 (but not the dummy recess region 20 of embodiments of the inventive concept) are provided at the edge of the cell array region CAR, the plating layer may be hardly formed at the edge of the cell array region CAR due to the presence of the suppressor 13 in the cell recess region 10.

In contrast, according to example embodiments of inventive concepts, the dummy pattern region DPR, rather than the cell pattern region CPR, may be provided at the edge of the cell array region CAR. The plating layer can thus be more uniformly formed, because the concentration of the suppressor 13 may be more uniform in the cell pattern region CPR due to the presence of the dummy pattern region DPR. In other words, the dummy pattern region DPR may have a pattern density that provides a transition (rather than the traditional abrupt change) between a pattern density of the peripheral circuit region PER and a pattern density of the cell pattern region CPR, thereby more evenly distributing the concentration of the suppressor 13.

Furthermore, if there is no dummy recess region 20, there may be an abrupt change in pattern density near a boundary between the peripheral circuit region PER and the cell array region CAR. This may lead to an abrupt change in area of the top surface of the seed layer 7 or the interlayer dielectric 5 relative to that of the peripheral circuit region PER, which may determine or influence a probability of existence of the suppressor 13. As a result, there may be an abrupt change in concentration of the suppressor 13 near a boundary between the peripheral circuit region PER and the cell array region CAR. For example, the concentration of the suppressor 13 may be higher at the edge of the cell array region CAR than at a more central portion of the cell array region CAR. Accordingly, in the traditional case where the cell recess regions 10 (but not the dummy recess region 20 of embodiments of the inventive concept) are provided at the edge of the cell array region CAR, the plating layer may be hardly formed at the edge of the cell array region CAR due to the presence of the suppressor 13 in the cell recess region 10.

In contrast, according to example embodiments of inventive concepts, the dummy pattern region DPR may be provided at the edge of the cell array region CAR. Since the occupying area ratio per unit area of the interlayer dielectric 5 in the dummy pattern region DPR may be smaller than in the peripheral circuit region PER and greater than in the cell pattern region CPR, the suppressor 13 in the dummy pattern region DPR may have a concentration ranging from that in the cell pattern region CPR to that in the peripheral circuit region PER. In other words, the dummy pattern region DPR can provide a transition between the area ratio of the interlayer dielectric 5 in the peripheral circuit region PER and the area ratio of the interlayer dielectric 5 in the cell pattern region CPR, which may enable a reduction in a concentration gradient of the suppressor 13 near the edge of the cell pattern region CPR. Accordingly, the concentration of the suppressor 13 may be more uniform over the substantially entire region of the cell pattern region CPR, and the plating layer can be more uniformly formed on the cell pattern region CPR.

Referring to FIGS. 2, 7, 8A and 8B, in the electroplating apparatus 300, the electric current used in the electroplating process may flow from the edge of the wafer 100 toward the center portion of the wafer 100, as depicted by the first arrow 70. This means that, according to a position of each chip region 50 in the wafer 100, a direction of flow of the electric current may be substantially parallel to a longitudinal direction (e.g., the first direction X) of the cell recess region 10, or may be substantially parallel to a transverse direction thereof (e.g., a second direction Y).

In the case where the electric current flow is substantially parallel to the first direction X, the electric current may be effectively flowed to portions of the seed layer 7, which are disposed in the cell recess regions 10 to have a relatively thin thickness (e.g., a second thickness T2), via other portions of the seed layer 7, which are disposed between the cell recess regions 10 to have a relatively thick thickness (e.g., a first thickness T1) on the interlayer dielectric 5. As a result, the plating layer can be formed without a void.

In contrast, in the traditional case where the electric current flow is substantially parallel to the second direction Y and the dummy pattern region DPR is not provided between the cell array region CAR and the peripheral circuit region PER, the electric current may flow through the portions of the seed layer 7 having the relatively thin thickness or the second thickness T2. This thin thickness may lead to an increase in electrical resistance of the portions of the seed layer 7, and thus, the electric current may not be sufficiently supplied to the center portion of the cell array region CAR. As a result, the plating layer may be formed to have a void in the cell array region CAR.

However, according to example embodiments of inventive concepts, since the dummy recess regions 20 having the relatively wide space D2 and the relatively short length L2 are disposed at the edge of the cell array region CAR, the electric current can be effectively and sufficiently supplied to the cell pattern region CPR via portions of the seed layer 7 having the relatively thick first thickness T1. As a result, the plating layer can be more uniformly formed without void formation therein.

Referring back to FIGS. 5A and 5B, the plating layer 9a and 9b may be formed in the cell recess region 10 and the dummy recess region 20 using the above-described electroplating process (in S40). The plating layer 9a and 9b may include the cell pattern 9a provided in the cell recess region 10 and the dummy pattern 9b provided in the dummy recess region 20.

Figure 9B:
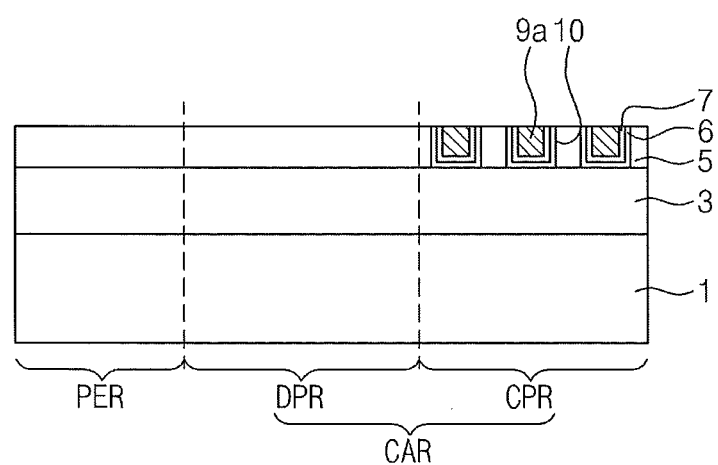

Referring to FIGS. 9A and 9B, a planarization and/or selective etching process may be performed to remove portions of the barrier layer 6, the seed layer 7, and the plating layer 9a and 9b on the interlayer dielectric 5 outside the trenches/recess regions 10 and 20 therein. Accordingly, the top surface of the interlayer dielectric 5 may be exposed, and the cell pattern 9a and the dummy pattern 9b may be localized within the cell recess region 10 and the dummy recess region 20, respectively.

Referring to FIGS. 2, 9A and 9B, a semiconductor device according to example embodiments of inventive concepts may include the substrate 1 with the cell array region CAR and the peripheral circuit region PER. The lower insulating layer 3 may be provided on the substrate 1. The interlayer dielectric 5 may be provided on the lower insulating layer 3. The cell array region CAR may include the cell pattern region CPR and the dummy pattern region DPR. The dummy pattern region DPR may be provided near the edge of the cell array region CAR. In other words, the dummy pattern region DPR may be disposed between the cell pattern region CPR and the peripheral circuit region PER. In the dummy pattern region DPR, there may be at least one dummy pattern 9b provided in the interlayer dielectric 5. In the cell pattern region CPR, there may be a plurality of cell patterns 9a provided in the interlayer dielectric 5. The barrier layer 6 and the seed layer 7 may be provided between the patterns 9a and 9b and the interlayer dielectric 5. As such, the dummy pattern(s) and the cell patterns may each define a conductive pattern including a plated layer 9b/9a, a seed layer 7, and a barrier layer 6. A space D2 between adjacent ones of the dummy patterns 9b may be greater than a space D1 between adjacent ones of the cell patterns 9a. In the first direction X, a length L2 of the dummy pattern 9b may be shorter than a length L1 of the cell pattern 9a.

In example embodiments of the inventive concepts, the above-described semiconductor devices may be used to realize a variety of semiconductor memory devices, such as flash memory devices, variable resistance memory devices, or dynamic random access memory devices. In these semiconductor memory devices, at least one of the cell patterns 9a may be used as an interconnection line, such as a bit line, and at least one of the dummy patterns 9b may be used as a test pattern.

Figure 10:
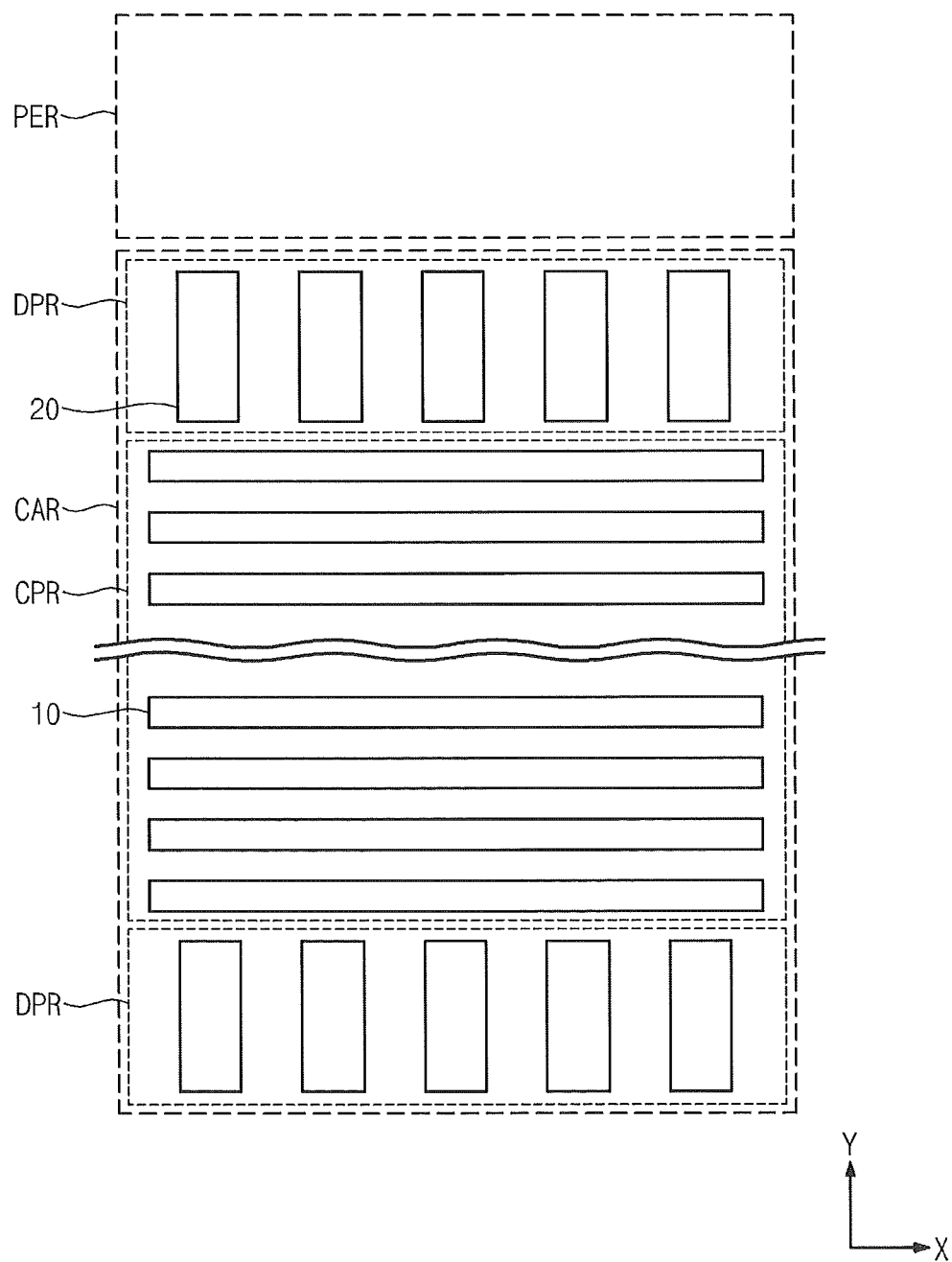
FIG. 10 is a plan view of a substrate according to other example embodiments of the inventive concepts.

FIG. 10 is a plan view of a substrate according to other example embodiments of the inventive concepts. Referring to FIG. 10, a dummy recess region 20 according to the present embodiments may be formed to have a bar shape continuously extending along the second direction Y. For example, the dummy recess region 20 may be formed to have a longitudinal axis orthogonal to the cell recess regions 10.

Figure 11:
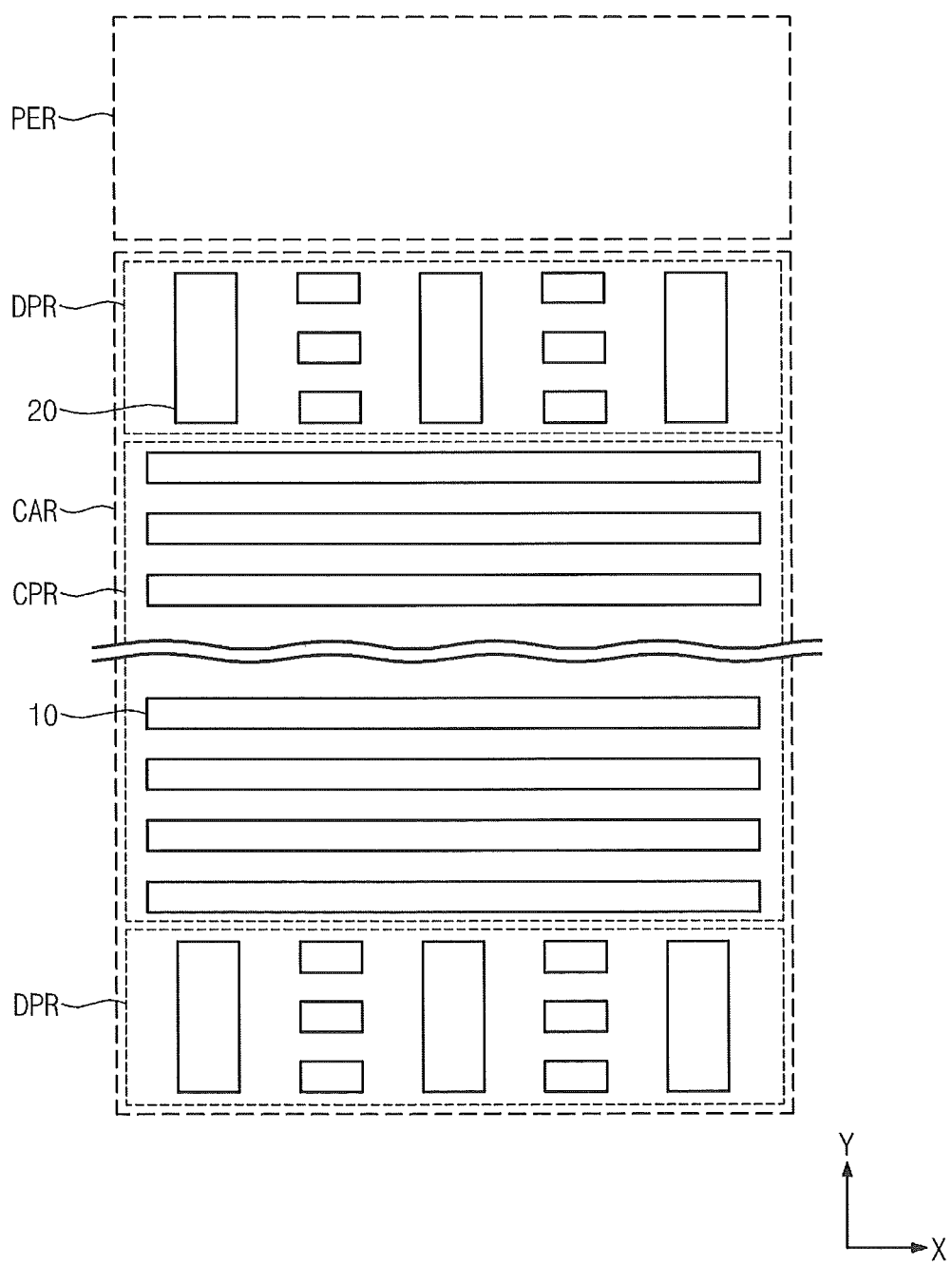
FIG. 11 is a plan view of a substrate according to still other example embodiments of the inventive concepts.

FIG. 11 is a plan view of a substrate according to still other example embodiments of the inventive concepts. Referring to FIG. 11, a dummy pattern region DPR according to the present embodiments may be configured to include at least two types of dummy recess regions 20. In other words, one of the dummy recess regions 20 may be different from other in terms of shape or longitudinal direction. As shown in FIG. 11, the dummy pattern region DPR may include both the hole-shaped or otherwise discontinuous dummy recess regions 20 of FIG. 2, as well as the bar-shaped or continuous dummy recess regions 20 of FIG. 10 extending in the Y-direction.

In example embodiments of the inventive concepts, in plan view, a shape of the dummy recess region 20 may be shaped like one of circle, ellipse, triangle, quadrangle, or diamond shapes.

In methods of fabricating semiconductor devices according to example embodiments of inventive concepts, the dummy recess regions may be formed between the cell recess regions and the peripheral circuit region. The dummy recess regions may have a space larger than that of the cell recess regions, and also may have a length smaller than that of the cell recess regions and thus a top surface area of an interlayer dielectric may be greater in the dummy pattern region than in the cell pattern region. This difference in the top surface area of the interlayer dielectric enables to reduce a concentration gradient of a suppressor contained in a plating solution near the dummy pattern region, and it is possible to make the concentration of the suppressor more uniform in the cell pattern region. As a result, a plating layer can be more uniformly formed in the cell pattern region, without void formation therein.

Furthermore, due to the presence of the dummy pattern region, an electric current can be more effectively supplied to the cell pattern region. As a result, a plating layer can be more uniformly formed in the cell pattern region, without void formation therein.

While example embodiments of the inventive concepts have been particularly shown and described, it will be understood by one of ordinary skill in the art that variations in form and detail may be made therein without departing from the spirit and scope of the attached claims.

What is claimed is:

1. An integrated circuit device, comprising:
   a substrate including a cell array region and a peripheral circuit region; and
   a plurality of coplanar plated conductive patterns in the cell array region and separated from one another by an interlayer dielectric, the conductive patterns comprising a plurality of cell patterns and a plurality of dummy patterns provided between the cell patterns and the peripheral circuit region,
   wherein the cell patterns continuously extend along a first direction, and wherein the dummy patterns comprise a plurality of segments that discontinuously extend along the first direction and are separated from one another by the interlayer dielectric,
   wherein a density of the dummy patterns is less than that of the cell patterns in the cell array region and greater than that of patterns in the peripheral circuit regions.

2. The device of claim 1, wherein the cell patterns are spaced apart from each other along a second direction crossing the first direction, and
   wherein a length of each of the segments of the dummy patterns is shorter than that of each of the cell patterns, in the first direction, and
   wherein a space between adjacent segments of the dummy patterns in the first direction is greater than that between adjacent ones of the cell patterns in the second direction.

3. A semiconductor device, comprising:
   a substrate including a cell array region and a peripheral circuit region;
   an interlayer dielectric disposed on the substrate;
   a plurality of cell patterns disposed in the cell array region, each of the cell patterns being provided in the interlayer dielectric; and
   a plurality of dummy patterns disposed in the cell array region, the dummy patterns being provided between the cell patterns and the peripheral circuit region,
   wherein a space between adjacent ones of the dummy patterns is greater than that between adjacent ones of the cell patterns, and wherein each of the cell patterns has a substantially linear shape continuously extending along a first direction, and each of the dummy patterns has a bar shape extending along a second direction crossing the first direction.

4. The device of claim 3, wherein a length of the dummy pattern is shorter than that of the cell pattern, in the first direction.

5. The device of claim 3, wherein the cell array region comprises a cell pattern region, in which the cell patterns are provided, and a dummy pattern region, in which the dummy patterns are provided, and wherein the dummy pattern region is positioned between the cell pattern region and the peripheral circuit region.

6. The device of claim 5, wherein an area occupied by the interlayer dielectric in the dummy pattern region is smaller than that in the peripheral circuit region and greater than that in the cell pattern region.

7. The device of claim 5, wherein the cell array region comprises a plurality of the dummy pattern regions, which are symmetrically disposed with respect to the cell pattern region.

8. An integrated circuit device, comprising:
   a substrate including a cell array region and a peripheral circuit region; and
   a plurality of coplanar plated conductive patterns in the cell array region and separated from one another by an interlayer dielectric, the conductive patterns comprising a plurality of spaced apart cell patterns and a plurality of spaced apart dummy patterns, wherein the dummy patterns are arranged between the cell patterns and the peripheral circuit region,
   wherein the cell patterns respectively comprise a substantially linear shape continuously extending along a first direction, and wherein the dummy patterns respectively comprise a bar shape extending along a second direction crossing the first direction.

9. The device of claim 8, wherein adjacent segments of the dummy patterns are separated by a distance greater than that between adjacent ones of the cell patterns.

10. The device of claim 9, wherein an area of the interlayer dielectric between the dummy patterns is greater than an area of the interlayer dielectric between the cell patterns in the cell array region.

11. The device of claim 10, wherein the area of the interlayer dielectric between the dummy patterns is less than an area of the interlayer dielectric between patterns in the peripheral circuit region.

12. The device of claim 9, wherein the conductive patterns respectively comprise one or more of a plated layer, a seed layer, and a barrier layer.

* * * * *